(12) United States Patent
Park et al.

(10) Patent No.: US 8,179,685 B2
(45) Date of Patent: May 15, 2012

(54) PRINTED CIRCUIT BOARD AND DISPLAY APPARATUS HAVING THE SAME

(75) Inventors: Hyo-Hyun Park, Daegu (KR); Hyun-Woo Nam, Asan-si (KR)

(73) Assignee: Samsung Electronics Co., Ltd. (KR)

( * ) Notice: Subject to any disclaimer, the term of this patent is extended or adjusted under 35 U.S.C. 154(b) by 786 days.

(21) Appl. No.: 12/251,552

(22) Filed: Oct. 15, 2008

(65) Prior Publication Data
US 2009/0098776 A1    Apr. 16, 2009

(30) Foreign Application Priority Data

Oct. 15, 2007  (KR) .................. 10-2007-0103423

(51) Int. Cl.
*H05K 7/00* (2006.01)
(52) U.S. Cl. .................... 361/760; 361/761; 439/630
(58) Field of Classification Search .............. 361/760, 361/761; 439/630
See application file for complete search history.

(56) References Cited

U.S. PATENT DOCUMENTS

| 5,380,221 A | 1/1995 | Grabbe |
| 2007/0176613 A1* | 8/2007 | Ogawa et al. ............. 324/754 |

FOREIGN PATENT DOCUMENTS

| KR | 19950002115 | | 1/1995 |
| KR | 1020030071629 A | | 9/2003 |
| KR | 1020060037922 A | | 5/2006 |

* cited by examiner

*Primary Examiner* — Yuriy Semenenko
*Assistant Examiner* — Andargie M Aychillhum
(74) *Attorney, Agent, or Firm* — Cantor Colburn LLP

(57) ABSTRACT

A printed circuit board on which a connector is mounted includes an insulating layer through which holes are formed and a supporting layer. An upper surface of the supporting layer is attached to the connector. The supporting layer is disposed on an upper surface of the insulating layer, is extended from the upper surface of the insulating layer to a lower surface of the insulating layer, and passes through the holes in order to support the connector. The holes are arranged in a plurality of columns each being parallel to a longitudinal direction of a lateral surface of the connector.

17 Claims, 6 Drawing Sheets

PRINTED CIRCUIT BOARD AND DISPLAY APPARATUS HAVING THE SAME

This application claims priority to Korean Patent Application No. 2007-103423, filed on Oct. 15, 2007, and all the benefits accruing therefrom under 35 U.S.C. §119, the contents of which in its entirety are herein incorporated by reference.

BACKGROUND OF THE INVENTION

1. Field of the Invention

The present invention relates to a printed circuit board and a display apparatus having the printed circuit board.

2. Description of the Related Art

A liquid crystal display apparatus includes a printed circuit board on which various driving devices are mounted. The various driving devices convert image signals provided from an external system into image signals suitable for a liquid crystal display panel. The printed circuit board has a connector in order to receive the image signals from the external system. The connector is divided into a transmitting connector and a receiving connector. The transmitting connector is disposed in the external system, and the receiving connector is mounted on the printed circuit board. As the transmitting connector and the receiving connector are connected to each other, the printed circuit board is electrically connected to the external system to receive the image signals from the external system.

Moreover, the printed circuit board includes connection pads for an attachment of the receiving connector, and connection terminals of the receiving connector are soldered to the connection pads of the printed circuit board through a soldering process, respectively. Thus, the receiving connector is mounted on the printed circuit board.

However, when a force is continuously applied to the printed circuit board in a vertical direction against a surface of the printed circuit board while the transmitting connector and the receiving connector are repeatedly attached and detached from each other, the receiving connector is separated from the printed circuit board. Further, when the connection pads are separated from the printed circuit board while including the connection terminals attached by the soldering process, the printed circuit board is damaged.

BRIEF SUMMARY OF THE INVENTION

Since a transmitting connector of an external system may be repeatedly attached and detached from a receiving connector of a printed circuit board, the printed circuit board may become damaged. For example, a connection pad of the printed circuit board, which is attached to the receiving connector, may become separated from a base (e.g. insulating layer) of the printed circuit board when the transmitting and receiving connectors are repeatedly attached and detached.

An exemplary embodiment provides a printed circuit board to prevent separation of a connection pad from the insulating layer of the printed circuit board.

An exemplary embodiment provides a display apparatus having the printed circuit board.

In an exemplary embodiment, a printed circuit board on which a connector is mounted includes an insulating layer through which a plurality of holes are formed, and a supporting layer. The supporting layer includes an upper surface attached to the connector. The supporting layer is formed on an upper surface of the insulating layer and is extended from the upper surface of the insulating layer to a lower surface of the insulating layer, and passes through the holes to support the connector.

The holes are arranged in a plurality of columns, each of the columns being extended substantially parallel to a longitudinal direction of a lateral surface of the connector. The lateral surface of the connector is perpendicular to a longitudinal direction of the connector.

In an exemplary embodiment, a printed circuit board on which a connector is mounted includes an insulating layer and a supporting layer. The insulating layer includes a plurality of holes formed partially through the insulating layer. The supporting layer includes a first portion disposed on an upper surface of the insulating layer and attached to the connector, and a second portion continuous with the first portion, extended from the upper surface of the insulating layer into the plurality of holes, and including a portion extending substantially parallel to the upper surface of the insulating layer. An entire surface of the insulating layer exposed in the plurality of holes is covered by the second portion of the supporting layer. The plurality of holes are disposed adjacent to an exposed portion of the first portion of the supporting layer, are arranged in a plurality of columns. Each of the plurality of the columns is extended substantially parallel to a longitudinal direction of a lateral surface of the connector. The lateral surface extends perpendicular to a longitudinal direction of the connector and perpendicular to the upper surface of the insulating layer.

In an exemplary embodiment, a display apparatus includes a display panel and a printed circuit board. The display panel displays images in response to driving signals. The printed circuit board is electrically connected to the display panel to provide the driving signals to the display panel through a connector mounted thereon. The printed circuit board includes an insulating layer and a supporting layer. The insulating layer is provided with a plurality of holes formed therethrough. The supporting layer includes an upper surface attached to the connector. The supporting layer is disposed on an upper surface of the insulating layer and is extended from the upper surface of the insulating layer to a lower surface of the insulating layer, and through the holes to support the connector.

The holes are arranged in a plurality of columns, each of the columns being substantially parallel to a lateral surface of the connector. The lateral surface of the connector is vertical to a longitudinal direction of the connector.

In an exemplary embodiment, a method of forming a printed circuit board attached to a connector includes forming a plurality of holes at least partially through an insulating layer, forming a first portion of a supporting layer on an upper surface of the insulating layer, an exposed portion of the first portion being attached to the connector, forming a second portion of the supporting layer continuous with the first portion, and extending from the first portion and into the plurality of holes, the second portion being disposed on inner surfaces of the plurality of holes, and forming a third portion of the supporting layer to extend from the second portion and in a direction substantially parallel to the upper surface of the insulating layer. The forming a plurality of holes includes disposing the plurality of holes adjacent to the exposed portion of the first portion, and arranging the plurality of holes in a plurality of columns. Each of the plurality of columns being extended substantially parallel to a longitudinal direction of a lateral surface of the connector. The lateral surface extending perpendicular to a longitudinal direction of the connector and perpendicular to the upper surface of the insulating layer.

In an exemplary embodiment, a plurality of holes are formed in a peripheral region of a connection pad to penetrate an insulating layer. A supporting layer is disposed in and through the holes, thereby supporting the connection pad and reducing or effectively preventing separation of the connection pad from the insulating layer. Thus, damage to a printed circuit board including the connection pad and the insulating layer may be reduced or effectively prevented.

BRIEF DESCRIPTION OF THE DRAWINGS

The above and other advantages of the present invention will become readily apparent by reference to the following detailed description when considered in conjunction with the accompanying drawings wherein.

DETAILED DESCRIPTION OF THE INVENTION

Figure 1:
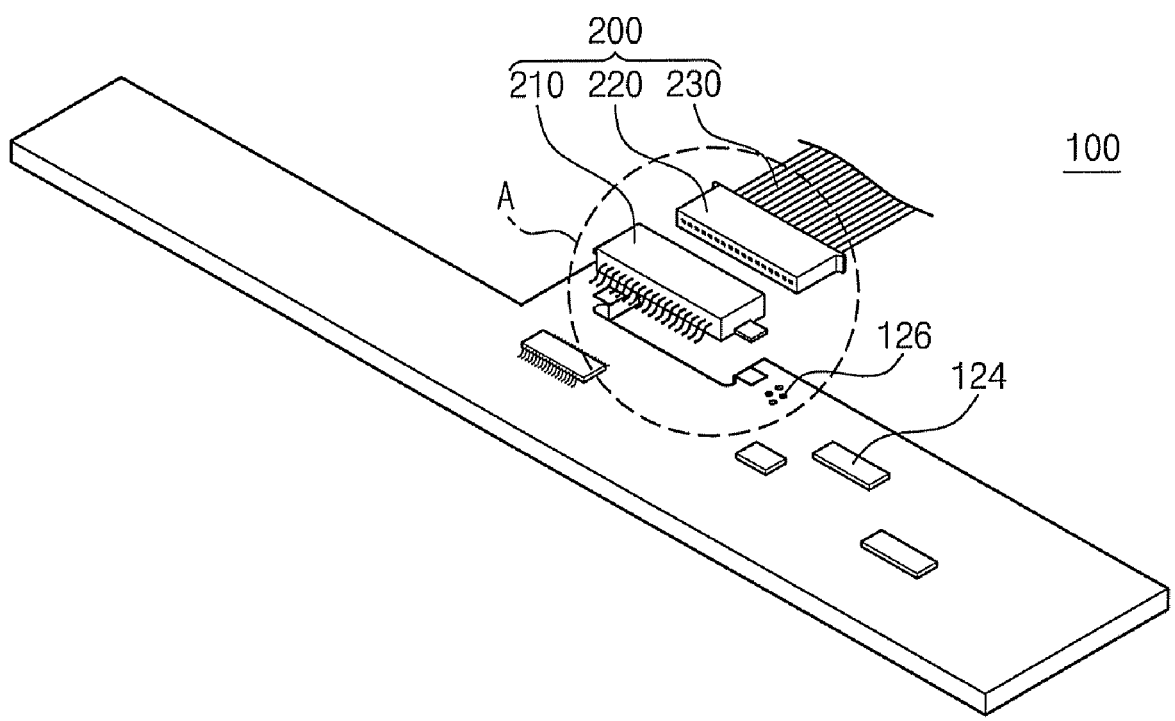
FIG. 1 is an exploded perspective view showing an exemplary embodiment of a printed circuit board according to the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the thickness of layers, films, and regions are exaggerated for clarity.

It will be understood that when an element such as a layer, film, region, or substrate is referred to as being "on" another element, it can be directly on the other element or intervening elements may also be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numerals refer to like elements throughout.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "below," "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "lower" relative to other elements or features would then be oriented "above" or "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

Hereinafter, the present invention will be described in detail with reference to the accompanying drawings.

Figure 2:
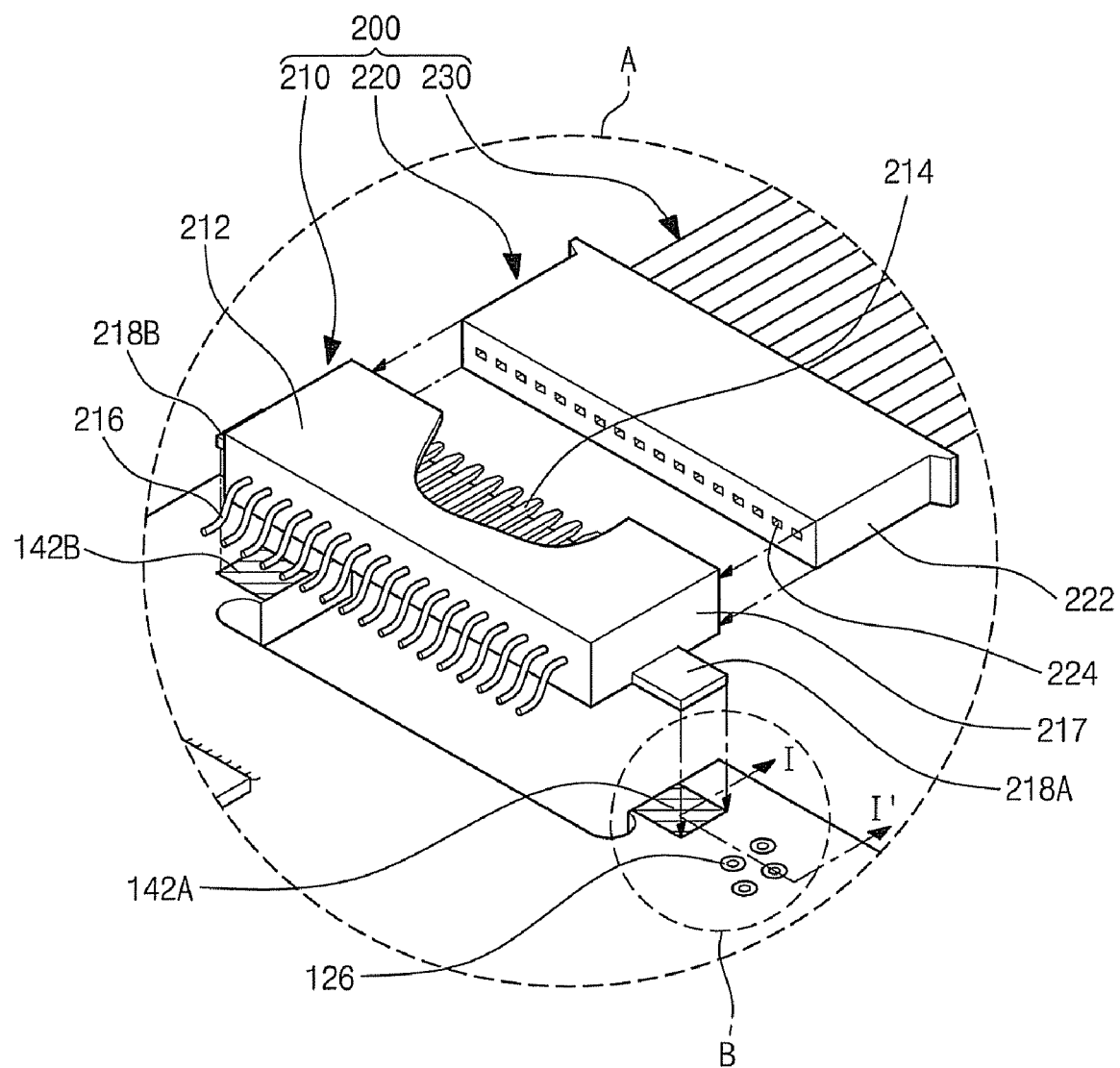
FIG. 2 is an enlarged perspective view showing portion 'A' of FIG. 1.

FIG. 1 is an exploded perspective view showing an exemplary embodiment of a printed circuit board according to the present invention, and FIG. 2 is an enlarged perspective view showing portion 'A' of FIG. 1.

Referring to FIGS. 1 and 2, a printed circuit board 100 includes an upper surface, a lower surface, and a plurality of lateral surfaces which connect the upper and lower surfaces. Driving devices 124 are mounted on the upper and/or lower surfaces of the printed circuit board 100. The driving devices 124 generate various signals (e.g., driving signals) using signals (e.g., control signals) applied from a main board (not shown). The driving devices 124 may be electrically interconnected to each other through conductive interconnections (not shown) which are patterned on the upper surface, on the lower surface or on both the upper and lower surfaces, respectively.

Further, the printed circuit board 100 includes first connection pad 142A and second connection pad 142B, and a first connector 210 including first connection terminal 218A and second connection terminal 218B disposed at opposite ends thereof. The first and second connection terminals 218A and 218B of the first connector 210 are connected with the first and second connection pads 142A and 142B, respectively, and thus the first connector 210 may be mounted on the printed circuit board 100.

The first connector 210 includes a first body 212, a plurality of connection pins 214, a plurality of lead terminals 216, and the first and second connection terminals 218A and 218B. The first body 212 has a substantially rectangular shape including a first face (surface), a second face (surface) opposite to the first surface, and a plurality of lateral faces (surfaces). The second surface is opposite to the first surface of the first body 212, and faces the upper surface of the printed circuit board 100. The lateral surfaces of the first body 212 are disposed between the first and second surfaces of the first body 212, and connect the first and second surfaces of the first body 212 to each other. The connection pins 214 of the first connector 210 are extended substantially laterally (or horizontally) toward a second connector 220 from an inner face of a lateral surface of the plurality of the lateral surfaces of the first body 212, the inner face and the lateral surface of the first body 212 facing the second connector 220.

In the exemplary embodiment, the second connector 220 includes a second body 222 and a plurality of inserting holes 224. The second body 222 has a substantially rectangular shape including a first surface, a second surface opposite to the first surface, and a plurality of lateral surfaces which connect the first and second surfaces. The inserting holes 224 of the second connector 220 are formed on an outer surface of a lateral surface of the plurality of lateral faces of the second body 222 and face the connection pins 214 of the first connector 210. The inserting holes 224 of the second connector 220 may correspond to the connection pins 214 of the first connector 210 in one-to-one fashion.

The connection pins 214 of the first connector 210 are inserted into the inserting holes 224, respectively, the inserting holes 224 receiving the connection pins 214. Thus, the first connector 210 may be electrically connected to the second connector 220 through the connection pins 214 being received by and inserted into the inserting holes 224. In an exemplary embodiment, the second connector 220 is electrically connected to the main board (not shown) through a connecting portion 230. In FIG. 2, the first connector 210 and the second connector 220 have been shown to act as a male connector and a female connector, respectively. However, in an alternative embodiment, the first connector 210 and the second connector 220 may be respectively a female connector and a male connector. The first connector 210, the second connector 220 and the connecting portion 230 are hereinafter collectively referred to as a connecting member 200.

The lead terminals 216 of the first connector 210 are protruded from an outer surface of the lateral surface on which the connection pins 214 are formed. The lead terminals 216 are protruded in a direction opposite to the extension direction of the connection pins 214, relative to the lateral surface of the first body 212. First end portions of the lead terminals 216 are connected to the connection pins 214, respectively, and second end portions opposite to the first end portion of the lead terminals 216 are electrically connected to signal lines (not shown) formed on the printed circuit board 100, such as through a soldering process. Thus, when the first connector 210 is connected with the second connector 220, the printed circuit board 100 may receive the signals provided from the main board, e.g. a main printed circuit board, through the first and second connectors 210 and 220, respectively.

The first and second connection terminals 218A and 218B of the first connector 210 are respectively connected to the first and second connection pads 142A and 142B disposed on the upper surface of the printed circuit board 100, such as through a soldering process, so that the first connector 210 may be mounted on the printed circuit board 100.

When the first connector 210 and the second connector 220 are repeatedly attached and detached from each other, the first and second connection pads 142A and 142B of the printed circuit board 100 coupled with the first and second connection terminals 218A and 218B of the first connector 210 may become separated from the printed circuit board 100, thereby causing gradual damage of the printed circuit board 100.

In order to reduce or effectively prevent the first and second connection pads 142A and 142B from being separated from the printed circuit board 100, various arrangements of holes and supporting members may be provided in the printed circuit board 100. Referring to the exemplary embodiment illustrated in FIGS. 1 and 2, a plurality of holes 126 are formed in a peripheral region adjacent to the first and second connection pads 142A and 142B. The holes 126 penetrate the printed circuit board 100, and may be formed completely through a thickness of the printed circuit board 100, or alternatively, partially through the thickness of the printed circuit board 100 as is suitable for the purpose described herein. Supporting patterns (see, FIGS. 3 and 4) are extended from the first and second connection pads 142A and 142B and respectively formed through the holes 126 of the printed circuit board 100 to correspond to an inner structure of the holes 126. The supporting patterns may reduce or effectively prevent the separation of the first and second connection pads 142A and 142B from the printed circuit board 100.

The holes 126 may be arranged on the peripheral region of the first and second connection pads 142A and 142B in various shapes and patterns. The various arrangements of the holes 126 may more effectively prevent the separation of the first and second connection pads 142A and 142B from the printed circuit board 100.

Hereinafter, structures of the supporting patterns will be described with reference to FIGS. 3 and 4, and various arrangements of the holes 126 will be described with reference to FIGS. 5 to 7.

Figure 3:
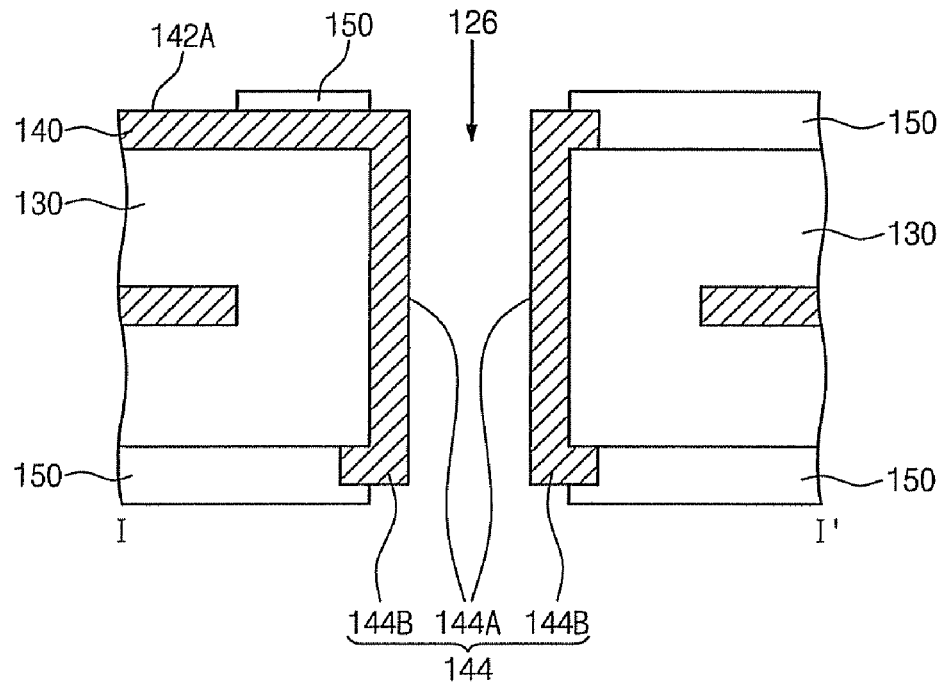
FIG. 3 is a cross-sectional view taken along line I-I' of FIG. 2.

FIG. 3 is a cross-sectional view taken along line I-I' of FIG. 2.

Referring to FIG. 3, the printed circuit board 100 includes an insulating layer 130, a supporting layer 140, and a protection layer 150.

A plurality of holes 126 are formed in the insulating layer 130 corresponding to the peripheral region of the first connection pad 142A. In the illustrated exemplary embodiment, the peripheral region is positioned at a position adjacent to the lateral surface 217 (refer to FIG. 2) of the first connector 210. The lateral surface 217 is disposed substantially perpendicular (e.g., vertical) to a longitudinal direction of the first connector 210. The holes 126 disposed in the printed circuit board 100 at the peripheral region are arranged in a plurality of columns substantially parallel to the lateral surface 217 of the first connector 210. In one exemplary embodiment, the holes 126 are arranged in at least two columns.

The holes 126 may be formed into a through-hole shape, such as completely penetrating the insulating layer 130, such that an opening is formed in both the upper surface and the lower surface of the printed circuit board 100. Alternatively, the holes 126 may be formed into a non-through hole shape formed by partially removing the insulating layer 130. In FIG. 3, the holes 126 are illustrated as the through-hole shape penetrating the insulating layer 130, and the holes 126 having the non-through hole shape will be described with reference to FIG. 4.

The supporting layer 140 includes the first connection pad 142A and a supporting pattern 144. In exemplary embodiments, the supporting layer 140 may be formed of a conductive material, including but not limited to, copper. The first connection pad 142A is formed on an upper surface of the insulating layer 130 and is respectively connected with the connection terminal 218A of the first connector 210. The first connection terminal 218A may be connected to the first connection pad 142A through the soldering process, but any of a number of methods may be used as is suitable for the purpose of connecting the first connection terminal 218A to the first connection pad 142A.

Referring again to FIG. 3, the supporting pattern 144 includes a first supporting pattern 144A and a second supporting pattern 144B. The first supporting pattern 144A is extended from the first connection pad 142A in a first direction substantially perpendicular to the upper surface of the insulating layer 130 (e.g., vertically). The second supporting pattern 144B is extended from the first connection pad 142A in a second direction substantially parallel to the upper surface of the insulating layer 130 (e.g., horizontally). The second direction is substantially perpendicular to the first direction. In an exemplary embodiment, the first connection pad 142A and the supporting pattern 144 are made of the same material. The first connection pad 142A and the supporting pattern 144 are continuously formed with each other, such as to form a unitary and indivisible element.

The first supporting pattern 144A is extended from the first connection pad 142A and is disposed on an inner surface of the holes 126. As illustrated in the exemplary embodiment of FIG. 3, the first supporting pattern 144A is formed on an entire of the insulating layer 130 disposed at the inner surface of the hole 126. The second supporting pattern 144B is extended from the first supporting pattern 144A and is formed on a portion of a lower surface of the insulating layer 130, such as extending a predetermined distance in a direction away from the hole 126.

The second supporting pattern 144B of the supporting pattern 144, which is extended from the first connection pad 142A and formed on the lower surface of the insulating layer 130, supports the first connection pad 142A to allow the first connection pad 142A to not be separated from the insulating layer 130 when an external force is applied to remove the first connector 210 from the printed circuit board 100. Advantageously, separation of the first connection pad 142A of the printed circuit board 100 from the insulating layer 130 may be reduced or effectively prevented while the first connection pad 142A is bonded with the first connection terminal 218A of the first connector 210, even if the second connector 220 and the first connector 210 are repeatedly attached and detached from each other.

As illustrated in FIG. 3, the protection layer 150 is formed on the insulating layer 130 and the supporting layer 140. The protection layer 150 is partially removed to expose the first connection pad 142A through the removed portion in a shape and dimension such that the first connection pad 142A may be connected with the first connection terminal 218A of the first connector 210. In the illustrated exemplary embodiment, the protection layer 150 has been partially removed such that the first connection pad 142A is exposed in a substantially square shape. However, the protection layer 150 may be partially removed to expose the first connection pad 142A in any of a variety of shapes, such as circular, rectangular, or triangular in a plan view, such that the first connection pad 142A corresponds to the first connection terminal 218A in shape and size, and the first connection pad 142A and the first connection terminal 218A may be connected.

In an exemplary embodiment, the protection layer 150 protects a circuit pattern (not shown) formed of the same material as the supporting layer 140 from the exterior impacts and reduces, or effectively prevents, contamination of the circuit pattern. In one exemplary embodiment, the protection layer 150 may include a solder resist or a photo solder resist, but is not limited thereto.

Meanwhile, a cross-sectional structure of a supporting layer 140 and a structure of holes 126 formed on a peripheral region of the second connection pad 142B of the printed circuit board 100 are substantially the same as those of the supporting layer 140 and the holes 126 formed on the peripheral region of the first connection pad 142A. Accordingly, detailed descriptions of the cross-sectional structure of the supporting layer 140 and the structure of holes 126 formed on the peripheral region of the second connection pad 142B will be omitted.

Figure 4:
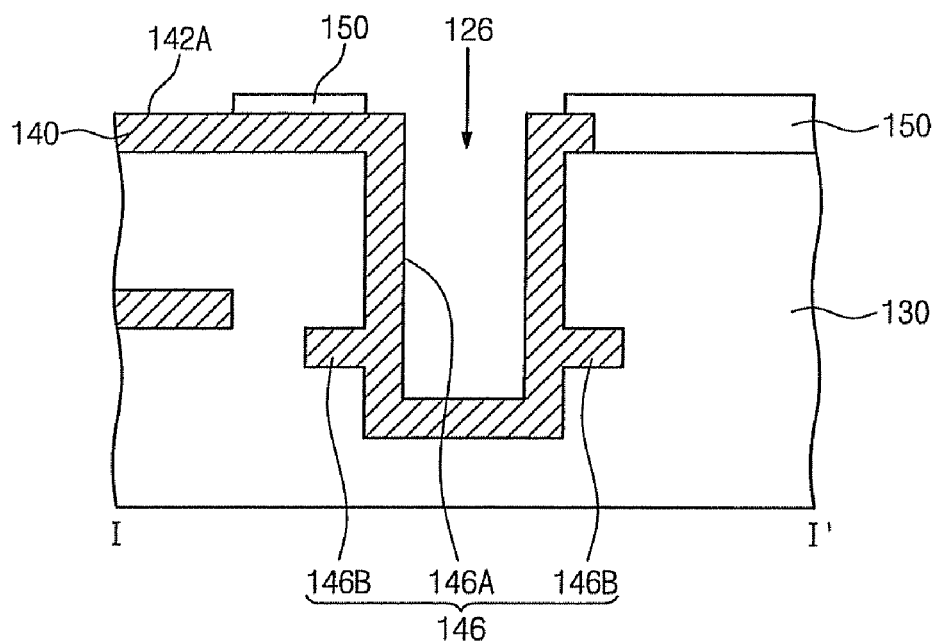
FIG. 4 is a cross-sectional view showing an alternative exemplary embodiment of a supporting layer of FIG. 3 according to the present invention.

FIG. 4 is a cross-sectional view showing an alternative exemplary embodiment of a supporting layer of FIG. 3 according to the present invention.

Referring to FIG. 4, a plurality of holes 126 formed in the non-through hole shape by partially removing the insulating layer 130 are disposed corresponding to the peripheral region of the first connection pad 142A. The supporting layer 140 includes a first connection pad 142A and a supporting pattern 146. The first connection pad 142A is formed on an upper surface of the insulating layer 130. The supporting pattern 146 includes a first supporting pattern 146A and a second supporting pattern 146B. The first supporting pattern 146A is extended from the first connection pad 142A at the upper surface of the insulating layer 130 and towards the lower surface of the insulating layer 130 in a first (substantially vertical) direction. The first supporting pattern 146A is disposed on an inner surface and a bottom surface of each hole 126. The first supporting pattern 146A is disposed on a whole surface of the insulating layer 130 exposed in the non-through hole 126.

The second supporting pattern 146B is extended from the first supporting pattern 146A at the inner surface of the hole 126 and into the insulating layer 130 which is not exposed in the hole 126 in a second (substantially horizontal) direction. The second direction is substantially perpendicular to the inner surface of the hole 126 and substantially parallel to the upper and lower surfaces of the insulating layer 130. The second supporting pattern 146B is considered as being buried into an internal portion of the insulating layer 130.

As shown in FIG. 4, the second supporting pattern 146B buried into the internal portion of the insulating layer 130 is substantially parallel to the first connection pad 142A in a cross-sectional view, and partially overlaps with the first connection pad 142A in a plan view, so that the second supporting pattern 146B may support and fix the first connection pad 142A. Advantageously, separation of the first connection pad 142A from the insulating layer 130 is reduced or effectively prevented when an external force is applied, such as to detach the first connector 210 from the second connector 220.

Although the first connector 210 and the second connector 220 may be repeatedly attached and detached from each other, separation of the first connection pad 142A from the insulating layer 130 of the printed circuit board 100 may be reduced or effectively prevented. Advantageously, a proper bonding state between the first connection terminal 218A and the first connector 210 to the first connection pad 142A and the printed circuit board 100 may be maintained.

As in the illustrated exemplary embodiments through the structures of the holes 126 formed on the insulating layer 130, and through the structures of the supporting patterns 144 and 146 extended from the first and second connection pads 142A and 142B of the printed circuit board, separation of the first and second connection pads 142A and 142B from the printed circuit board 100 may be reduced or effectively prevented.

Additionally, since the holes 126 are arranged in various arrangements on the peripheral region of the first and second connection pads 142A and 142B, the separation of the first and second connection pads 142A and 142B from the insulating layer 130 of the printed circuit board 100 may be further reduced or prevented. Advantageously, when the supporting patterns 144 and 146 disposed on the printed circuit board 100 corresponding to the shapes and profiles of the holes 126, are disposed with various arrangements in the peripheral region, a stress applied to the first and second connection pads 142A and 142B may be dispersed throughout the peripheral region, thereby reducing or effectively preventing the separation of the first and second connection pads 142A and 142B from the printed circuit board 100. In order to disperse the stress applied to the first and second connection pads 142A and 142B, the holes 126 may be arranged in a plurality of columns in the peripheral region.

Figure 5:
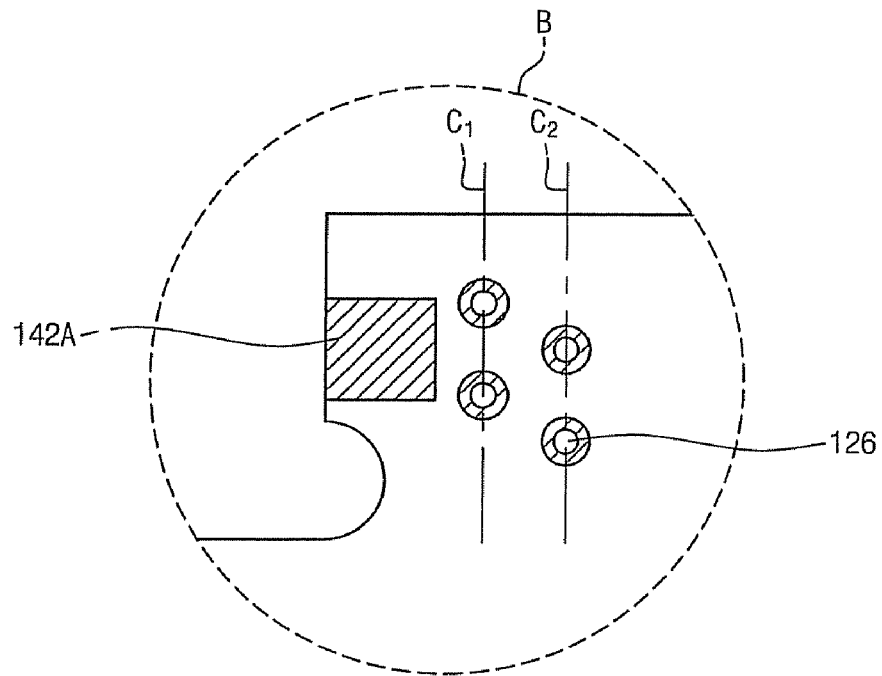
FIGS. 5 to 7 are top plan views showing various exemplary embodiments of portion 'B' of FIG. 2, including arrangement patterns of holes formed in a peripheral region of a connection pad according to the present invention.
Figure 6:
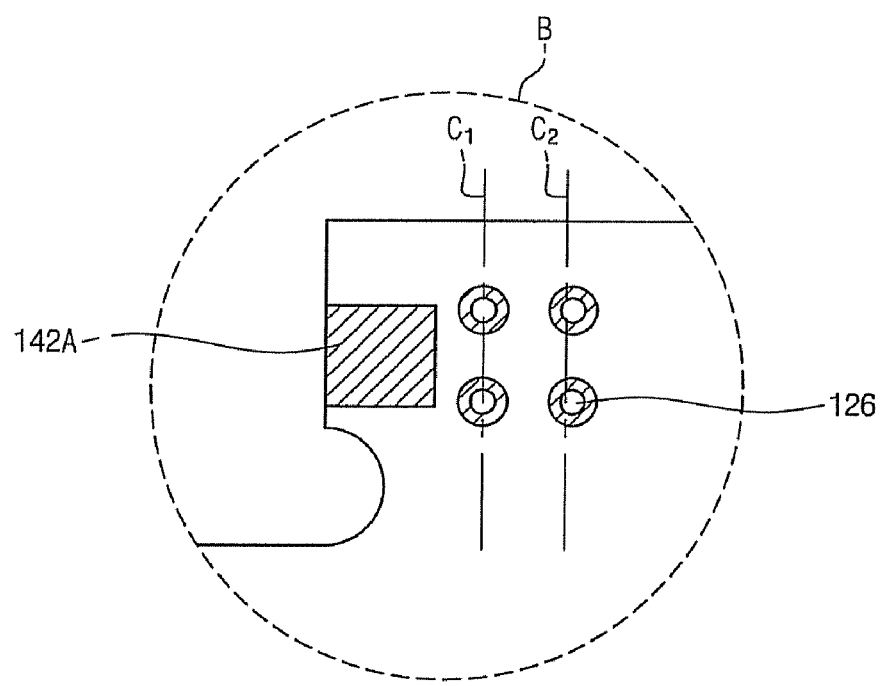
Figure 7:
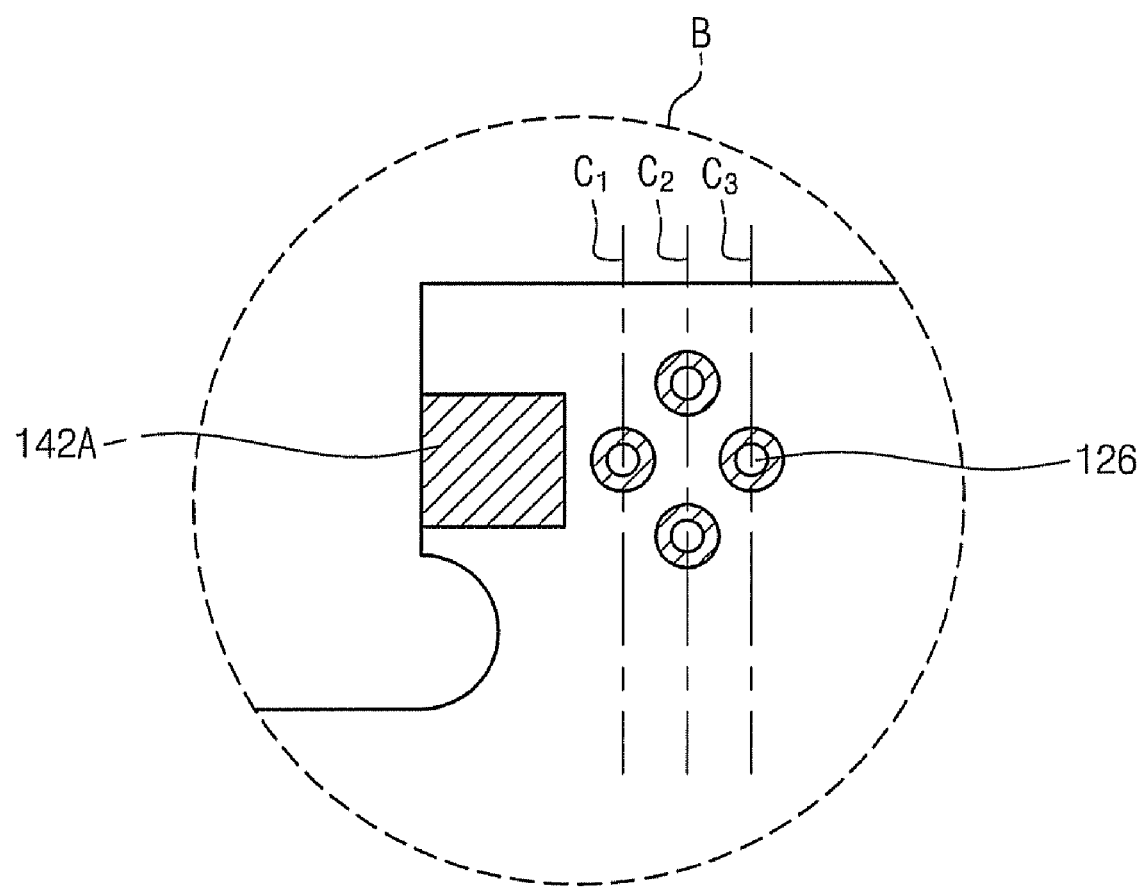

FIGS. 5 to 7 are top plan views showing exemplary embodiments of portion 'B' of FIG. 2, including various arrangement patterns of the holes formed in the peripheral region of the first connection pad according to the present invention.

Referring to FIG. 5, the holes 126 are arranged in a first column $C_1$ and a second column $C_2$ in the peripheral region of the first connection pad 142A. The holes 126 are arranged substantially linearly in the respective columns, as indicated by the vertical broken lines. The first and second columns $C_1$ and $C_2$ are extended substantially parallel to a longitudinal direction of the lateral surface 217 of the connector 210 (refer to FIG. 2). In the illustrated exemplary embodiment of FIG. 5, the holes 126 arranged in the first column $C_1$ are alternately positioned with the holes arranged in the second column $C_2$ in a longitudinal (e.g., linear) direction of the columns. That is, a collective group of the holes 126, including the holes 126 in the first and second columns $C_1$ and $C_2$ of FIG. 5, are arranged substantially in a zigzag shape when taken in the longitudinal direction of the columns.

Consequently, the supporting pattern 144 (refer to FIG. 3) extended from the first connection pad 142A of the printed circuit board 100 is arranged in a zigzag shape in a peripheral region of the first connection pad 142A. Accordingly, the stress applied to the first connection pad 142A of the printed circuit board 100 may be dispersed through the peripheral region by the supporting pattern 144 arranged in the zigzag shape. Advantageously, separation of the first connection pad 142A from the insulating layer 130 may be reduced or effectively prevented.

In FIG. 6, similar to the arrangement of holes 126 shown in FIG. 5, the holes 126 are arranged in two linear extended columns $C_1$ and $C_2$, which are both parallel to the longitudinal direction of the lateral surface 217 of the connector 210 (refer to FIG. 2). However, the holes 126 arranged in the first column $C_1$ and the holes arranged in the second column $C_2$ are arranged in a same row, respectively, such that the rows are also linearly extended. In other words, the four holes 126, which may be collectively referred to as a "group" of the holes 126, are arranged in a substantially square shape in a plan view.

Alternatively, the holes 126 may be arranged in a substantially rectangular shape in a plan view. Additionally, adjacent holes 126 arranged along the first column $C_1$ may have an interval therebetween different from an interval between adjacent holes 126 arranged along the second column $C_2$. When the intervals between adjacent holes 126 is not the same, the holes 126 disposed in the peripheral region adjacent to the connection pads 142A and 142B may be arranged in a substantially trapezoid shape in a plan view, where a length of the first column $C_1$ in a longitudinal direction of the first column $C_1$ is shorter than a length of the second column $C_2$ in a longitudinal direction of the second column $C_2$.

A location of the holes 126 in the peripheral region relative to borders (or edges) the connection pads 142A and 142B may include the holes 126 overlapping the borders of the connection pads 142A and 142B, as shown in FIG. 6. For example, taken in a horizontal direction of the plan view in FIG. 6, a portion of each of the holes 126 overlaps an upper or a lower (horizontal) boundary of the first connection pad 142A. Alternatively, a portion of most of the holes 126 in FIG. 5 overlaps the upper or the lower (horizontal) boundary of the first connection pad 142A, or is disposed completely between the upper and lower boundaries of the first connection pad 142A. A remainder of the holes 126 in FIG. 5 is completely below the lower boundary of the first connection pad 142A. In alternative embodiments, a portion of the holes may also overlap the right (vertical) boundary of the first connection pad 142A, instead of the group of holes 126 being completely to the right of the vertical boundary of the first connection pad 142A as shown in FIGS. 5 and 6. With the various arrangements of the holes 126, and consequently the supporting layer 140, relative to the borders of the first connection pad 142A, separation of the first connection pad 142A from the insulating layer 130 of the printed circuit board 100 may be advantageously reduced or effectively prevented.

In FIG. 7, a plurality of holes 126 are arranged in three columns $C_1$, $C_2$ and $C_3$ which are extended substantially parallel to the longitudinal direction of the lateral surface 217 of the connector 210 (refer to FIG. 2). The plurality of holes 126 in FIG. 7, may also be considered as being arranged in three substantially parallel rows extended in a direction perpendicular to the longitudinal direction of the later surface 217.

Referring to FIG. 7, one hole 126 is positioned in a first column $C_1$ which is closest (e.g., adjacent to) to the lateral surface 217 of the first connector 210, one hole 126 is positioned in a third column $C_3$ which is farthest from the lateral surface 217 of a connector 210, and two holes 126 are positioned in a second column $C_2$ which is arranged between the first column $C_1$ and the third column $C_3$ relative to the lateral surface 217. The holes 126 in the second column $C_2$ are disposed staggered from the holes 126 in the first and second columns $C_1$ and $C_3$. That is, a number of the holes 126 in each column alternates between one and two when taken from a point adjacent to the lateral surface 217 and in a direction away from the lateral surface 217 of the first connector 210. Consequently, the holes 126 shown in FIG. 7 are arranged in a substantially lozenge or diamond shape in a plan view. As described above, the arrangement of the holes 126 may be varied according to the number of holes 126 positioned in each column and row, respectively.

Figure 8:
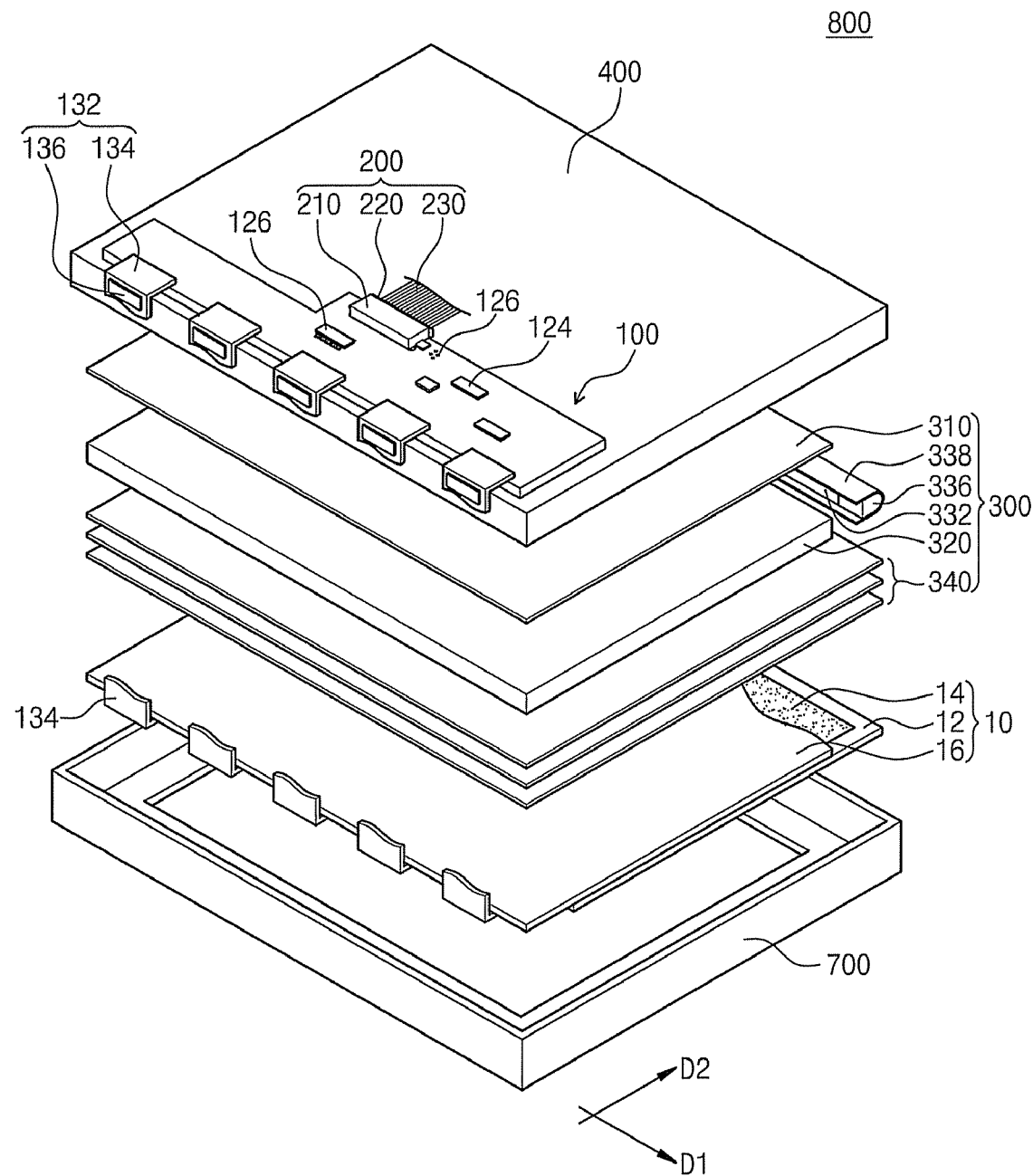
FIG. 8 is an exploded perspective view showing an exemplary embodiment of a display apparatus according to the present invention.

FIG. 8 is an exploded perspective view showing an exemplary embodiment of a display apparatus according to the present invention.

In FIG. 8, as a representative display apparatus, such as a liquid crystal display apparatus is shown. Therefore, configurations of the printed circuit board 100 according to the present invention may be embodied in many different display apparatuses and should not be construed as limited to the liquid crystal display apparatus set forth herein. Accordingly, the printed circuit board 100 may be applied to various display apparatuses, including but not limited to, a plasma display device ("PDP"), and an organic light emitting diode ("OLED") device. In the illustrated exemplary embodiment, the printed circuit board 100 as described above is installed on a rear surface of the liquid crystal display apparatus. Thus, the same elements as those in FIGS. 1 to 7 will be assigned by the same reference numerals, and detailed descriptions of the same elements will be omitted.

Referring to FIG. 8, the liquid crystal display apparatus 800 includes a display unit displaying images using light, and a backlight assembly 300 providing the light to the display unit. The liquid crystal display apparatus 800 further includes a mold frame 400 and a (lower) chassis 700 receiving the display unit and the backlight assembly 300.

The display unit includes the liquid crystal display panel 10, the printed circuit board 100, and tape carrier packages (hereinafter, referred to as "TCP") 132.

The liquid crystal display panel 10 includes a thin film transistor ("TFT") substrate 12, a color filter substrate 16, and a liquid crystal 14 interposed between the TFT substrate 12 and the color filter substrate 16.

The liquid crystal display panel 10 displays images by using the light provided from the backlight assembly 300. Gate lines (not shown) are formed along a first direction D1 on the TFT substrate 12, and data lines (not shown) are formed on the TFT substrate 12 along a second direction D2 substantially perpendicular to the first direction D1. Pixels (not shown) which are electrically connected to the gate lines and the data lines are formed on the TFT substrate 12, such as in a matrix configuration to display the images.

Various driving devices are mounted on the printed circuit board 100 to generate data and gate signals which drive the liquid crystal display panel 10, and timing signals which control timings of the data and gate signals, respectively. The gate and data signals are applied to the gate line and data lines of the TFT substrate 12 through the TCPs 132.

Each TCP 132 includes a base film 134 and a driving IC 136. The driving IC 136 is mounted on the base film 134. The base film 134 includes the driving IC 136, and may further include conductive interconnections (not shown), and metallic interconnections (not shown) which connect the gate lines and the data lines of the liquid crystal display panel 10. Accordingly, the TFT substrate 12 is electrically connected with the printed circuit board 100 through the TCPs 132.

The backlight assembly 300 includes a reflecting plate 310, a light guide plate 320, a lamp assembly, and optical sheets 340. The lamp assembly includes a lamp 332, a lamp holder 336, and a lamp cover 338. The reflecting plate 310 reflects the light emitted from the lamp 332. The light guide plate 320 guides the light emitted from the lamp 332 to the liquid crystal display panel 10. The lamp holder 336 is coupled to opposite end portions of the lamp 332, and fixes the lamp 332 to the lamp cover 338. The lamp assembly is received in the mold frame 400. The optical sheets 340 improve the brightness characteristic of the light exiting from the light guide plate 320 and advancing to the liquid crystal display panel 10. In exemplary embodiments, the lamp 332 may be a cold cathode fluorescent lamp, a light emitting diode, a line light source, a surface light source, and so on.

The liquid crystal display apparatus 800 includes the mold frame 400 and the chassis 700 to receive and hold the backlight assembly 300 therein. The mold frame 400 receives the liquid crystal display panel 10 and the backlight assembly 300. The TCPs 132 are bent along an outer lateral surface of the mold frame 400, so that the printed circuit board 100, electrically connected to the liquid crystal display panel 10 through the TCPs 132, is fixed to a rear surface of the mold frame 400. The rear surface of the mold frame 400 opposes a viewing side of the liquid crystal display apparatus 800 relative to the backlight assembly 300. The chassis 700 presses an edge of the liquid crystal display panel 10 and is coupled with the mold frame 400 to fix the liquid crystal display panel 10 to the mold frame 400, thereby preventing the liquid crystal display panel 10 from being separated from the mold frame 400 and the chassis 700.

The liquid crystal display apparatus 800 may include the printed circuit board 100 illustrated with reference to FIGS. 1 to 7. As described above, the holes 126 are arranged in various arrangements the peripheral region of the first and second connection pads 142A and 142B of the printed circuit board. Also, the supporting patterns 144 and 146 extended from the connection pads 142A and 142B and into the holes 126, are formed into various shapes and profiles corresponding to the structures of the holes 126 in the peripheral regions. Advantageously, separation of the first and second connection pads 142A and 142B (refer to FIG. 2) formed on the printed circuit board 100 from the printed circuit board 100 may be reduced or effectively prevented, even if the first and second connectors 210 and 220 are repeatedly attached and detached from each other.

As in the illustrated embodiments, the holes are formed in a peripheral region of the connection pad and penetrate the insulating layer in part or in whole. The supporting layer formed through the holes support the connection pad, so that separation of the connection pad from the insulating layer may be reduced or effectively prevented.

Additionally, the holes and the supporting layer are arranged in the peripheral region in various arrangements, thereby further reducing or effectively preventing the separation of the connection pad from the insulating layer.

Advantageously, damage to the printed circuit board may be reduced or effectively prevented by the separation of the connection pad from the insulating layer.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A printed circuit board on which a connector is mounted, the printed circuit board comprising:

an insulating layer through which a plurality of holes is formed; and a supporting layer comprising an upper surface attached to the connector, the supporting layer being disposed on an upper surface of the insulating layer and extended from the upper surface of the insulating layer to a lower surface of the insulating layer, the supporting layer passing through the holes to support the connector, wherein the holes are arranged in a plurality of columns, each of the plurality of the columns being extended substantially parallel to a longitudinal direction of a lateral surface of the connector, and the lateral surface of the connector is perpendicular to a longitudinal direction of the connector.

2. The printed circuit board of claim 1, wherein the plurality of columns comprises a first column and a second column, and holes arranged in the first column are alternately positioned with holes arranged in the second column, in a plan view.

3. The printed circuit board of claim 2, wherein an interval between adjacent holes arranged in the first column is different from an interval between adjacent holes arranged in the second column, in the plan view.

4. The printed circuit board of claim 1, wherein the plurality of columns comprises a first column and a second column, and a number of holes arranged in the first column is different from a number of holes arranged in the second column, in a plan view.

5. The printed circuit board of claim 1, wherein the holes are arranged in a substantially square shape in a plan view.

6. The printed circuit board of claim 1, further comprising a plurality of conductive interconnections transmitting electrical signals, wherein the supporting layer comprises a same material as the conductive interconnections.

7. The printed circuit board of claim 6, wherein the conductive interconnections comprise copper.

8. The printed circuit board of claim 1, wherein the plurality of holes is at least four in number.

9. The printed circuit board of claim 1, wherein the supporting layer comprises:
a connection pad formed on the upper surface of the insulating layer, the connection pad being connected with the connector; and
a supporting pattern extended from the connection pad and toward the lower surface of the insulating layer, the supporting pattern being formed on inner surfaces of the holes and on the lower surface of the insulating layer.

10. A display apparatus comprising:
a display panel displaying images in response to driving signals; and
a printed circuit board electrically connected to the display panel and providing the driving signals to the display panel through a connector mounted on the printed circuit board,
the printed circuit board comprising:
an insulating layer provided with a plurality of holes formed therethrough; and
a supporting layer comprising an upper surface attached to the connector, the supporting layer being disposed on an upper surface of the insulating layer and extended from the upper surface of the insulating layer to a lower surface of the insulating layer and through the holes to support the connector,
wherein the holes are arranged in a plurality of columns, each of the plurality of the columns being extended substantially parallel to a longitudinal direction of a lateral surface of the connector, and the lateral surface of the connector is vertical to a longitudinal direction of the connector.

11. The display apparatus of claim 10, wherein the plurality of columns is at least two in number.

12. The display apparatus of claim 10, wherein the plurality of the columns comprises a first column and a second column, and holes arranged in the first column are alternately positioned with holes arranged in the second column.

13. The display apparatus of claim 10, wherein the holes are arranged in a substantially square shape in a plan view.

14. The display apparatus of claim 10, wherein the plurality of holes is at least four in number.

15. The display apparatus of claim 10, wherein the display panel is a liquid crystal display panel.

16. A printed circuit board on which a connector is mounted, the printed circuit board comprising:
an insulating layer including a plurality of holes formed partially therethrough; and
a supporting layer including:
a first portion disposed on an upper surface of the insulating layer and attached to the connector, and
a second portion continuous with the first portion, extended from the upper surface of the insulating layer into the plurality of holes, and including a portion extending substantially parallel to the upper surface of the insulating layer, wherein an entire surface of the insulating layer exposed in the plurality of holes is covered by the second portion of the supporting layer;
wherein the plurality of holes is disposed adjacent to an exposed portion of the first portion and the holes are arranged in a plurality of columns, each of the plurality of the columns being extended substantially parallel to a longitudinal direction of a lateral surface of the connector, the lateral surface extending perpendicular to a longitudinal direction of the connector and perpendicular to the upper surface of the insulating layer.

17. The printed circuit board of claim 16, wherein the second portion of the supporting layer includes a third portion extending from the second portion, extending substantially parallel to the upper surface of the insulating layer, and extending into an inner portion of the insulating layer.

* * * * *